United States Patent [19]

Guterman

[11] 4,267,558
[45] May 12, 1981

[54] ELECTRICALLY ERASABLE MEMORY WITH SELF-LIMITING ERASE

[75] Inventor: Daniel C. Guterman, Houston, Tex.

[73] Assignee: Texas Instruments Incorporated, Dallas, Tex.

[21] Appl. No.: 1,095

[22] Filed: Jan. 5, 1979

[51] Int. Cl.³ .................................. H01L 27/02
[52] U.S. Cl. ............................. 357/41; 357/22; 357/51; 357/59
[58] Field of Search ................ 357/23, 59, 41, 51

[56] References Cited

U.S. PATENT DOCUMENTS 4,099,196  7/1978  Simko ........................ 357/23

Primary Examiner—Edward J. Wojciechowicz
Attorney, Agent, or Firm—John G. Graham

[57] ABSTRACT

A non-volatile semiconductor memory device of the electrically erasable type employs a floating gate which is programmed by application of high voltage across the source and drain so that hot electrons traverse the gate oxide. The floating gate is discharged by electron tunneling through an erase window which is separated from the control gate. An over-erase sensor transistor separate from the memory transistor prevents the floating gate from being discharged below a point where the memory transistor will be depletion mode.

18 Claims, 18 Drawing Figures

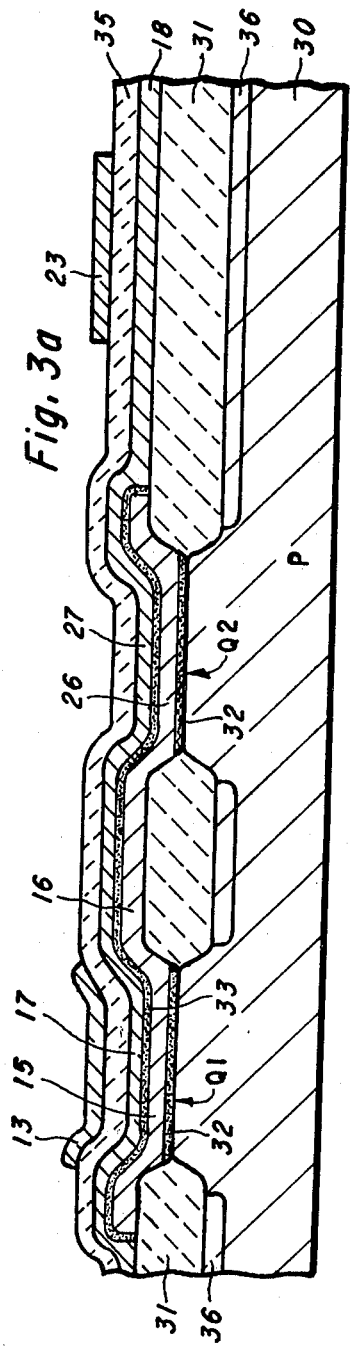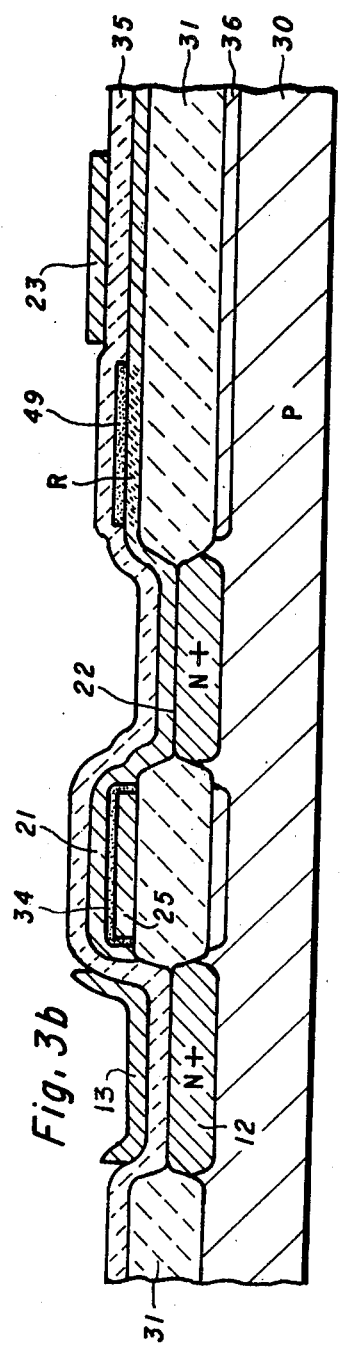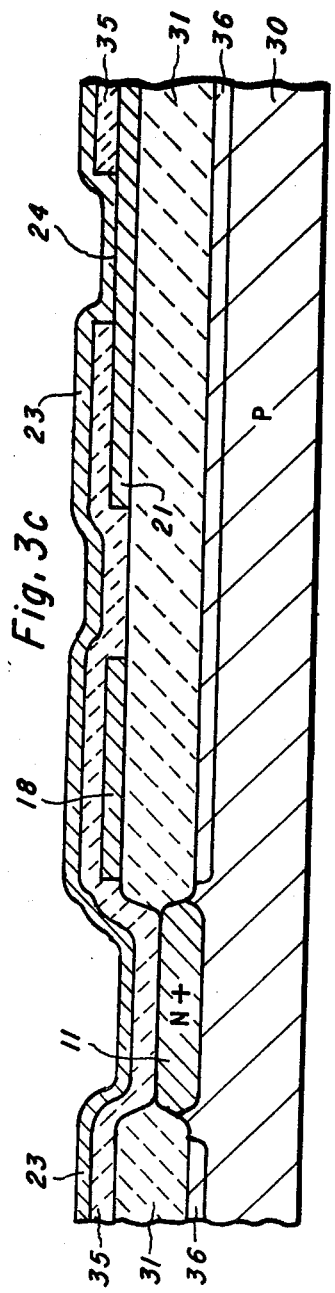

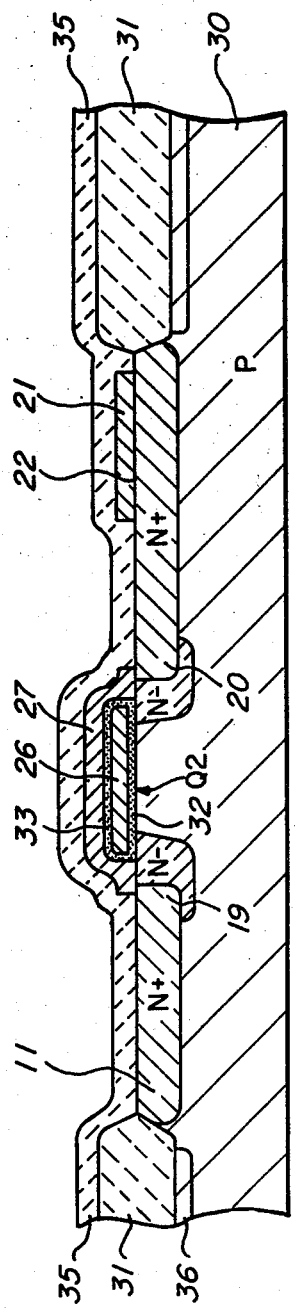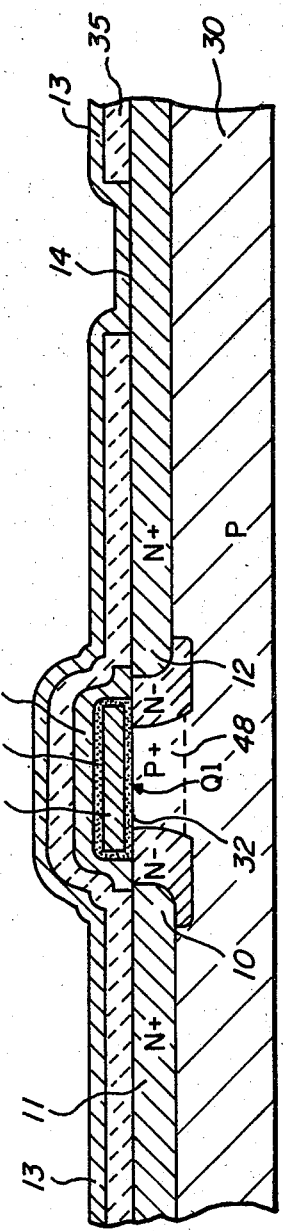
Fig. 3d
Fig. 3e

| | VOLTAGE, WITH RESPECT TO SUBSTRATE, ON: | | | |
|---|---|---|---|---|
| | ROW ADDRESS LINE 18 CONTROL GATE 17 | COLUMN ADDRESS LINE 13 | ERASE LINE 23 | COMMON SOURCE. LINE 11 |
| ERASE | 0 | 0 | +25V | 0 |
| ERASE INHIBIT | +25V | 0 | +25V | 0 |
| PROGRAM | +25V | +15V | 0 | 0 |
| READ | +3 TO 5V | TO SENSE AMP. | 0 | 0 |

Fig. 4

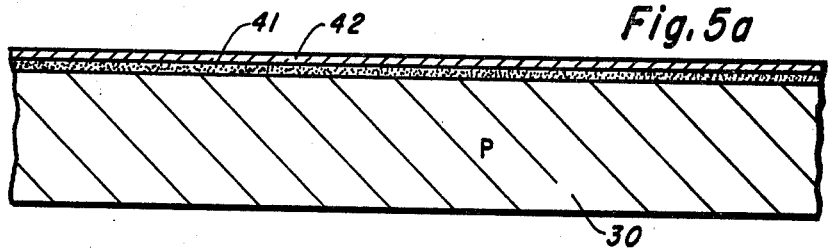
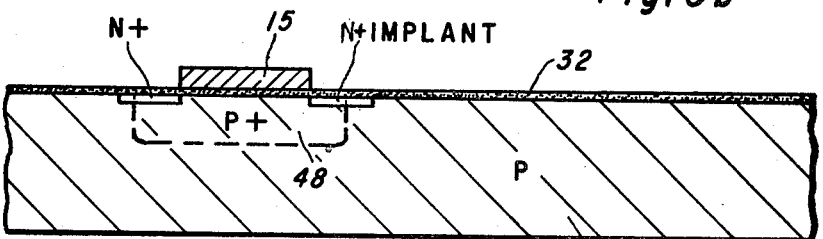
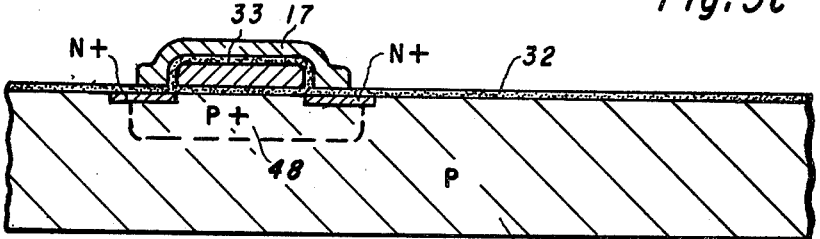
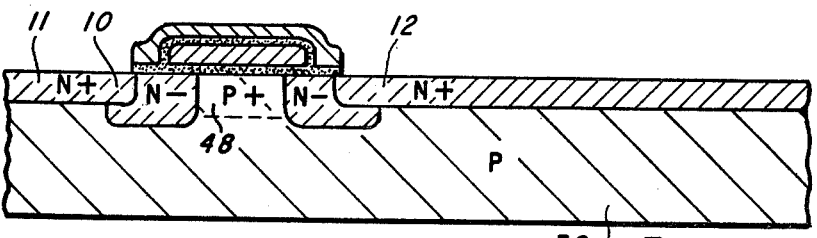

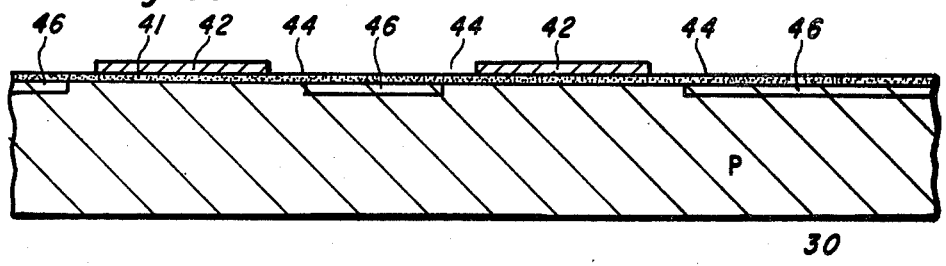
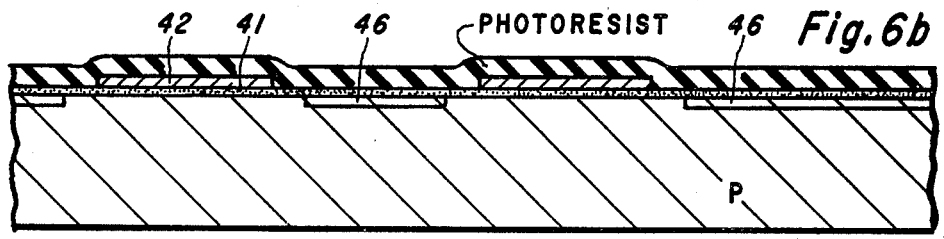
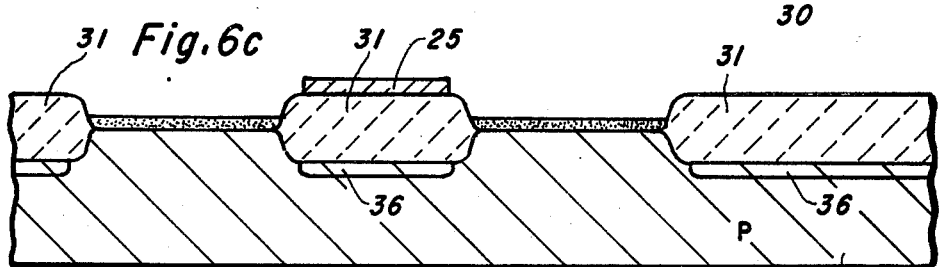
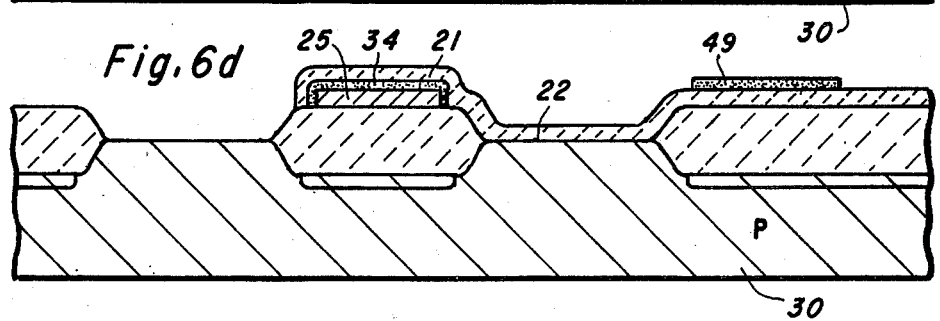
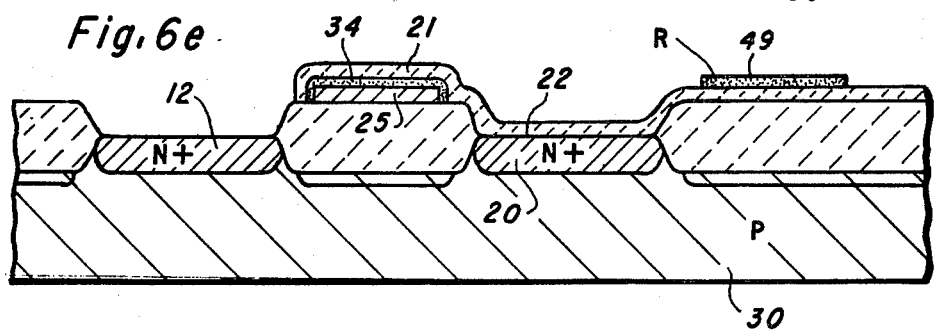

ELECTRICALLY ERASABLE MEMORY WITH SELF-LIMITING ERASE

BACKGROUND OF THE INVENTION

This invention relates to semiconductor memory devices, and more particularly to a non-volatile electrically erasable MOS memory of the floating gate type.

Electrically erasable floating gate memory devices the shown in U.S. Pat. Nos. 4,122,509 issued to L. S. Wall and 4,122,544 issued to D. S. McElroy, assigned to Texas Instruments, and in U.S. Pat. No. 3,984,822 issued to Simko et al. These devices allow electrical erasure by discharge of the floating gate through the oxide layer between the floating gate and the control gate, with proper voltages on the source, drain and control gate. One of the initial problems with these devices was over-erasure, which caused the channel beneath the floating gate to go into the depletion mode so the memory transistor would conduct even with zero volts on the control gate. The structure of the McElroy patent sought to correct this problem by adding a series enhancement transistor. Even this device still exhibited problems in some conditions. First, erasure was a competing mechanism during programming because the high positive voltage in the control gate, about +25 v, plus the negative charge on the floating gate, result in fields very close to those of erase under 30 to 35 v bias. Although the ratio of the capacitance of the floating gate to control gate to the capacitance of the floating gate to the substrate could be adjusted, improving programming would degrade erase and vice versa. The result was that the programming level attained was limited by the erase mechanism, and the programming time was lengthened somewhat. A second problem was that for a very good erase mechanism, a read disturb condition was a possibility, i.e., there would be loss of electrons from a programmed floating gate, especially at higher operating voltages, for example +10 v. Third, programming difficulty occured when the floating gate was overerased too far. This occured for two reasons. One, the effective gate voltage over the floating gate channel was higher and if it got too high for a given drain voltage the programming dropped. Two, the effective drain to source voltage decreased because the floating gate channel conductance was higher compared to the series enhancement device; this too would decrease programming.

It is therefore the principal object of this invention to provide an improved electrically erasable floating gate MOS memory device. Another object is to provide a floating gate EAROM which avoids overerasure problems.

SUMMARY OF THE INVENTION

In accordance with one embodiment of the invention, a non-volatile semiconductor memory device of the electrically erasable type employs a floating gate which is programmed by application of high voltage across the source and drain so that hot electrons traverse the gate oxide. The floating gate is discharged by electron tunneling through an erase window which is separated from the control gate. An overerase sensor transistor separate from the memory transistor prevents the floating gate from being discharged below a point where the memory transistor will be depletion mode.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a–3e are elavation views in section of the cell of FIG. 1, taken along the lines a—a, b—b, c—c, d—d, and e—e, respectively;

FIG. 4 is a table of voltages on the electrodes of the cell of FIG. 1 for various operating conditions; and FIGS. 5a–5e and 6a–6e are elevation views in section of the EAROM semiconductor device of FIGS. 1 and 3a–3e, at successive stages in the manufacturing process, taken generally along the lines a—a and b—b in FIG. 1.

DETAILED DESCRIPTION OF SPECIFIC EMBODIMENT

Figure 1:
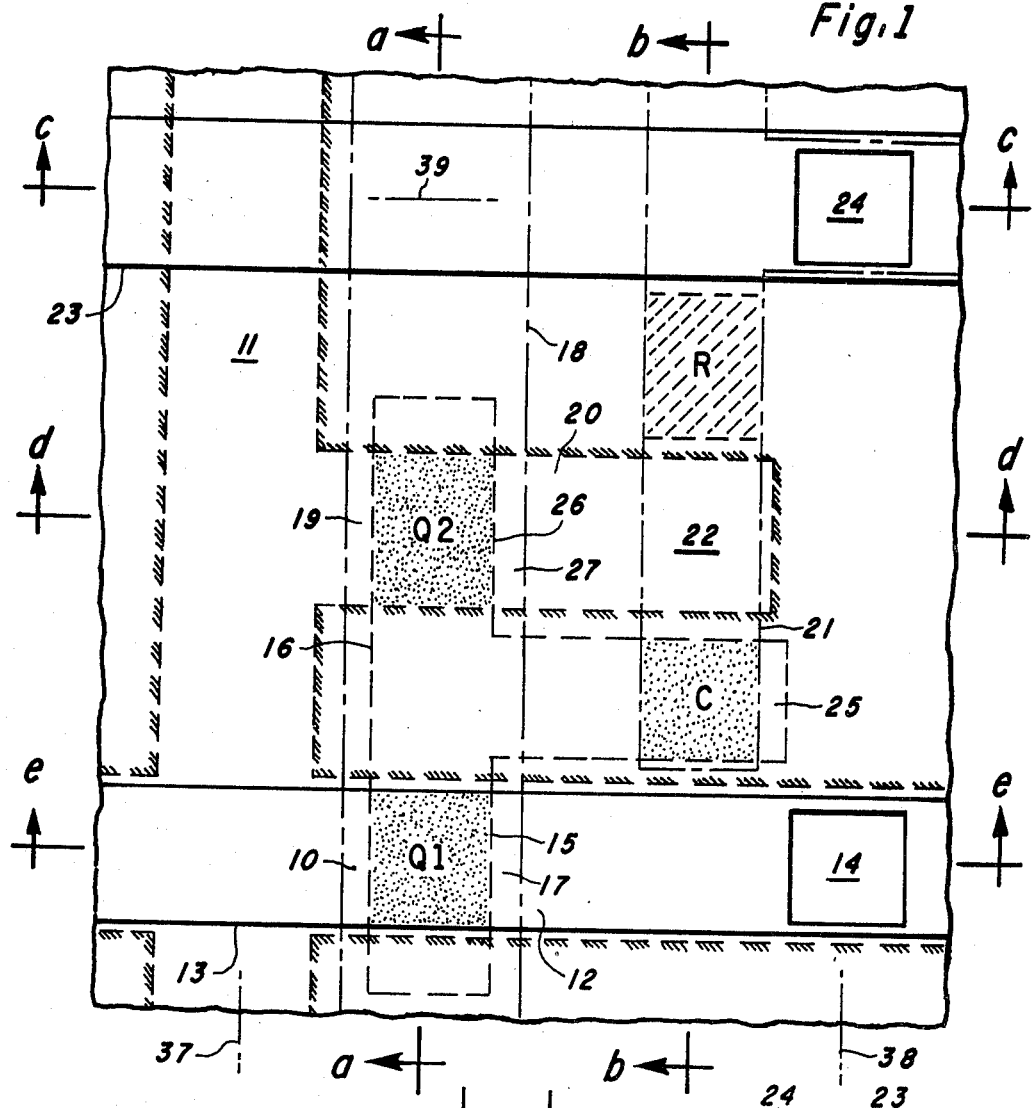
FIG. 1 is a greatly enlarged plan view of a small portion of a semiconductor chip showing the physical layout of one cell of an EAROM array made according to the invention.
Figure 2:
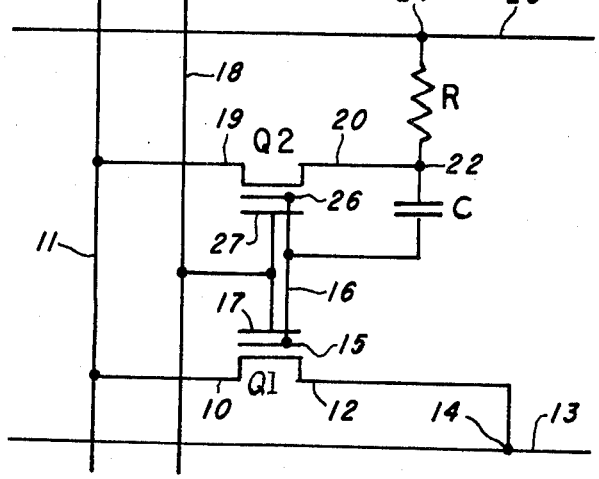
FIG. 2 is an electrical schematic diagram of the EAROM of FIG. 1.

With reference to FIG. 1, a layout of an electrically erasable memory cell in semiconductor integrated circuit form is shown greatly enlarged. The same cell is shown in schematic diagram form in FIG. 2 where the same reference numerals are used for the same elements and the physical positions are generally the same. The cell consists of a memory transistor Q1 which has a source region 10 connected to a common source line 11 and a drain 12 connected to a column address line 13 at a metal-to-moat contact 14. The transistor Q1 has a floating gate 15 which is part of a first level polysilicon segment 16, and has a control gate 17 which is part of a second level polysilicon strip 18 functioning as a row address line for an array of the cells. Another transistor Q2, functioning as an over-erase sensor, has a source 19 which is also part of the common source line 11 and a drain 20 which is connected to a second level poly strip 21 at a second-poly-to-moat contact 22. The strip 21 includes an implanted resistor R and an erase window C. The resistor R connects the drain 20 to an erase voltage line 23 by a metal-to-poly contact 24. The erase window C is an area of the second level poly strip 21 coupled to an area 25 of the first level poly segment 16 through thin oxide. The over-erase sensor Q2 also has a floating gate 26 which is part of the first level poly segment 16, and a control gate 27 which is part of the address line 18.

In FIGS. 3a–3e the physical structure of the cell of FIG. 1 is seen in more detail in a series of sectional views. The cell is formed in one face of a silicon semiconductor wafer or chip 30 which is predominately P-type. The common source region 11, the sources 10 and 19, and the drains 12 and 20 are formed by N+ diffused regions in "moat" areas in the face. The moat areas are depressed below the surface of thick field oxide 31 which covers all of the face except where moats exist. The first level polycrystalline silicon floating gates 15 and 26 are separated from the silicon surface by a thin gate oxide layer 32, and the control gates 17 and 27 are separated from the floating gates by a thin silicon oxide coating 33. A silicon oxide coating 34, different from the coating 33, separates the first level poly area 25 and the second level poly strip 21 at the erase window C. Aluminum strips forming the column address line 13 and the erase voltage line 23 are separated from the second level poly by a thick low-temperature deposited oxide coating 35. Beneath the field oxide layer 31 are P+ channel stop regions 36 as is standard practice in N-channel silicon gate integrated circuits.

The cell usually would be part of an array of perhaps 16 K or 16,384 cells in a single silicon chip, arranged in 128 rows and 128 columns of cells. Thus 128 of the row address lines 18 would be included, along with 128 of the column address lines 13. To conserve space, the common source line 11 would be shared with the row of cells to the left of the cell shown in FIG. 1, so the cell would be mirrored about an axis 37. Likewise, the cell to the right of the one shown would share the contacts 14 and 24, the cell being mirrored about an axis 38. Further, the cell above would share the contact 24 and the erase line 23, so it would be mirrored about an axis 39. A cell size of about one by one and one-half mils is obtained, so an array of 16K cells would occupy about 25,000 sq. mils on a chip, or less than 0.15 ×0.2 inch.

In operation, the memory cell Q1 functions as one bit of memory by storing a logic "1" of "0" depending upon whether the floating gate 15 is charged with electrons or discharged. When the row address line 18 is actuated or at logic 1 for this particular row (all other rows being at logic 0 or Vss), the transistor Q1 will turn on and be conductive from source 10 to drain 12 if the floating gate 15 is discharged, but will not turn on if the floating gate is charged negative because this will repel electrons from the channel region and effectively raise the threshold voltage of the transistor Q1. Thus, the column line 13, which is coupled to the output of the chip through a Y decoder when this particular cell is addressed, will discharge through the transistor Q1 to the grounded common source line 11 when the floating gate is discharged, but will not discharge if the floating gate is charged. To program or write into the cell, the row address line is held at about +25 volts, the common source 11 is at Vss, and the column address line 13 is brought up to a program voltage of about +15 to 18 V, much greater than logic 1 voltage. This causes high current from source to drain and electrons traverse the thin gate oxide 32 to the floating gate 15 where they are trapped. The leakage from the floating gate is very small so the device will stay programmed for many years.

According to the invention, electrical erase is provided by the erase window C along with the over-erase sensor Q2 and the erase bus line 23. electrical erase can only occur through the erase window C, not between the floating gates 15, 26 and the control gates 17, 27, because the interlevel oxide 34 is processed differently than the oxide 33. The overlap capacitance of the erase window C is made small compared to the capacitance to the control gates 17, 27 so that the floating gates 15, 26 are much more strongly coupled to the control gates than to the erase line 23. Erase is performed by bringing the erase line 23 high, to about +25 V, while connecting the row address line 18, the column address line 13 and the common source line 11 to ground or Vss. Since coupling to the control gate and substrate far outweighs that to the erase line the floating gate 15 will not move away from its original potential very much; if it has been programmed to a Vt of about +10 V it will not shift more than one volt or to a Vt of about +9 V due to capacitive coupling when the erase line goes high. Thus a large built in field of about 25 volts per 1000 Angstroms will be impressed across the interlevel oxide 34, and electrons will traverse this oxide. Erase will continue as long as the over-erase sensor transistor Q2 remains off, i.e., as long as the floating gate is partially programmed. Once the floating gate 26 has reached a sufficient amount of erase the over-erase sense transistor Q2 will turn on and the voltage on the erase node at the drain 20 will collapse as current is shunted through the transistor Q2 to the grounded common source line 11. The conductance of the transistor Q2 is large compared to that of the load resistor R. For a resistor value of 10 megohm the erase node voltage collapses rapidly to a value low enough to quench erase quickly and completely. Cells which are already in the erased state with no charge on the floating gates 15 and 26 are turned on immediately when the line 18 goes high; no erase voltage builds up on the erase at drain 20.

An "erase inhibit" operation is provided by holding the erase line 23 high at about +25 V, holding the control gates high by the row address line 18 at about +25 V or higher, and holding the source and drain lines 11 and 13 at ground. This inhibits erase in two ways. First, even when the cell is programmed high, Vt about +10 V, a 35V control gate level will be sufficient to turn on the over-erase sensor transistor Q2, thereby dropping the erase node voltage at the drain 20. Second, the strong coupling to the control gate will raise the floating gate voltage thereby reducing the voltage difference across the oxide layer 34 at the erase window C, thus reducing its erase function.

To guarantee that the memory transistor Q1 remains in the enhancement mode at the erase limit, in one modification, a Vt difference is created between the transistors Q1 and Q2. For example the memory transistor Q1 can be a standard EPROM device with a P+ tank having a Vt of about +3 to +4 V while the sensor transistor Q2 is a Vt adjusted EPROM device with no P+ tank having a Vt of about +1 to +2V. If the erase limit occurs when the sensor transistor Q2 first goes into depletion mode this results in the memory transistor Q1 having a Vt of about +1 to +2V at the erase limit. With the erase limit clamping the memory transistor Q1 in enhancement mode, no series enhancement transistor as in U.S. Pat. No. 4,122,544 is necessary.

A program operation is performed in the same way as a conventional EPROM with +15 to +18 V on the column line 13, about +25 V on the row address line 18, but with the erase line 23 held at ground to eliminate erase disturbance. The threshold voltage of a programmed memory transistor Q1 can be driven very high in a short time, greater than 10 V in less than 10 msec, conserving programming power. Also, either the common source 11 or the column address line 13 can supply the high drain voltage by virtue of the transistor symmetry. If a load other than a high resistance to the erase line is used, however, the column address should supply the drain voltage to avoid sizeable current flows from the common source to the erase node through the load.

Either block or bulk erase is possible by virtue of the erase inhibit function. For block erase, only one row address line 18 is held at zero, the others are held at about +25 V. For bulk erase all row address lines are at zero.

It is also important to note that no read disturb is encounterd in the cell of the invention due to the fact that the erase line 23 is held at ground during a read operation.

A summary of the typical operating conditions during the various modes of operation of the cell of the invention is shown in the Table of FIG. 4.

One of the major features of the cell of the invention is that there is no programming limitation due to a competing erase, i.e., under program conditions there is no tendency for the floating gate to erase. Another of the major features is that there is no read disturb, i.e., no loss of electrons from a programmed floating gate during a read operation. A third major feature is that there is no programming difficulty due to overerase.

Other benefits of the cell of the invention compared to previous cells are in the electrical specifications. There is more conductance in the memory transistors Q1 due to the elimination of the series enhancement transistor of U.S. Pat. No. 4,122,544. Lower erase voltages are required because of more optimum coupling between the floating gate and the control gate, erase node and substrate. Lower energy is required for programming because of the elimination of competing erase and the use of a more efficient EPROM transistor, resulting in a smaller product of channel current multiplied by programming time. An increase in the erase cycling capability is provided by reducing deterioration in two ways. First, erase deterioration occurring during programming due to simultaneous erase is eliminated, and second the cell does not use an erase mechanism any longer than is absolutely necessary per bit per erase cycle.

Instead of using a second level polysilicon implanted resistor as the load resistance R, an enhancement or depletion type load transistor could be used, somewhat simplifying the manufacturing process. However, a second level poly resistor is advantageous because it allows a smaller cell size and the resistance can be very large, ten megohm or higher. The resistor need only supply erase currents and diode leakage, less than about ten picoamps.

Turning now to FIGS. 5a-5e and 6a-6e, a process for manufacturing the devices described above will be explained. Note that FIGS. 5a-5e correspond to the sectional view of FIG. 3e in the finished device, that is to line e—e in FIG. 1, while FIGS. 6a-6e correspond to the sectional view of FIG. 3b, that is to the line b—b in FIG. 1.

This is basically an N-channel, silicon-gate, self-aligned, double level poly process for making MOS integrated circuit devices. The starting material is a slice of P-type monocrystalline semiconductor grade silicon, perhaps 3 inches in diameter, cut on the <100> plane, doped with boron in growing to a resistivity of about 6 to 8 ohm-cm. In the FIGURES the portions shown are only about one or two mils wide and represent very small parts of the slice, chosen as representative sample cross sections. First, after appropriate cleaning, the slice is oxidized by exposing to oxygen in a furnace at an elevated temperature of perhaps 1000 or 1100 Degrees C to produce an oxide layer 41 of a thickness of about 1000 Angstroms. Next, a layer 42 of silicon nitride $Si_3N_4$ of about 1000 Angstroms thickness is formed by exposing to an atmosphere of dichloro-silane and ammonia in a reator. A coating of photoresist is applied to the entire top surface, then exposed to ultraviolet light through a mask which defines the desired pattern, and developed. This leaves areas 44 where nitride is etched away using a plasma etch; these are the areas where field oxide 31 is to be grown. Another coating of photoresist may be applied and patterned to cover areas wider than which will be the moats. The purpose of this oversized moat mask is to prevent channel stop P+ regions from being in contact with N+ regions because lower breakdown would result at P+ to N+ junctions. High voltages are used in programming, compared to usual N-channel devices.

The slice is now subjected to an ion implant step, preferably using this oversized moat mask, whereby boron atoms are implanted in the areas of silicon not covered by photoresist which masks the implant. Boron is an impurity which produces P-type conductivity, so more heavily doped P+ regions 46 will be produced in the surface. The oxide layer 41 is left in place during the implant because it prevents the implanted boron atoms from out-diffusing from the surface during subsequent heat treatment. The boron implant is at a dosage of about $4+10^{13}/cm^2$ at 100 KeV. After the implant, the photoresist layers are removed.

As will be seen, the regions 46 do not exist in the same form in the finished device, because some of this part of the slice will have been consumed in the oxidation procedure. The implanted regions 46 will ultimately produce the P+ channel stop regions. Because of the oversized moat mask, the channel stop regions do not touch the channels or N+ regions.

Turning now to FIGS. 5b and 6b, the P+ tank implant step is illustrated. A coating of photoresist is applied, then patterned to expose only areas 47 in the cell array which are about the width of the second level poly. Then the slice is subjected to a boron implant step at a dosage of perhaps $7 \times 10^{12}$ at 100 KeV to produce implanted regions 48.

As set forth in U.S. Pat. No. 4,055,444 issued to G. R. Mohan Rao, assigned to Texas Instruments, the next step in the process is to subject the slice to a heat treatment or anneal step, during which the slice is maintained at a temperature of about 1000 degrees C. for perhaps approximately 2 hours in an inert atmosphere, preferably nitrogen. This step causes the implanted boron concentration to change and reduces bulk damage in the crystal structure caused by the implant. The implanted P+ regions will have penetrated deeper into the silicon surface after the anneal step.

The following step in the process is formation of field oxide, which is done by subjecting the slices to steam or an oxidizing atmosphere at over 900 degrees C. for several hours. As seen in FIGS. 5c and 6c, this causes a thick field oxide layer 31 to be grown, and this layer extends into the silicon surface because silicon is consumed as it oxidizes. The nitride layer 42 masks oxidation beneath it. The thickness of this layer 31 is about 8000 to 10,000 Angstroms, half of which is above the original surface and half below. The boron doped P+ regions 46 as previously implanted and modified by the anneal step, will be partly consumed, but boron will also diffuse further into the silicon ahead of the oxidation front. Thus, P+ channel stop regions 36 will result which will be deeper and of more uniform and acceptable concentration at the surface compared to what would have resulted without the anneal step. Also, the regions 36 will not have the extent of crystalline structure damage characteristic of implanted devices.

The nitride layer 42 and its underlying oxide layer 41 are removed by etching, as the next step, and another thin silicon oxide layer 32 of about 800 Angstroms is grown over the exposed areas of silicon. Windows for first level polysilicon to substrate contacts (none seen in these views) are patterned and etched using photoresist, removing the gate oxide layer 32 in selected areas. An implant to adjust the threshold of selected transistors may be performed at this point. For example, the transistor Q2 may be phosphorus implanted using a photoresist mask to produce a different Vt, as explained above. Next, a first layer of polycrystalline silicon is deposited over the entire slice in a reactor using standard techniques, for example for decomposition of silane in hydrogen at about 930 Degrees C. to a thickness of about 6000 Angstroms, producing the polysilicon which will ultimately form segments including the floating gates 15 and 26 and the part 25. The layer of poly may then be subjected to a phosphorus implant or diffusion to render it conductive. This diffusion does not penetrate the substrate 30 except at the poly to silicon contact areas if any (not shown).

The first level polysilicon coating and the underlying gate oxide layer 32 are next patterned. This is done by applying a layer of photoresist, exposing to ultraviolet light through a mask prepared for this purpose, developing, then etching with the remaining photoresist masking certain areas of the polysilicon. The slice is next subjected to a phosphorus implant which will create the lightly doped implanted source and drain N-regions using a photoresist mask to block off the implant outside of Q1 and Q2.

The dielectric layer 33 is next formed on the polysilicon by growing SiO2, depositing Si3N4, or forming a dual dielectric, producing a coating on all exposed surfaces of the poly, as seen in FIGS. 5a and 6d, including tops and sides. An SiO2 layer 33 may be grown at about 1100° C. in dry oxygen for about ½ hour or 900° C. in steam, producing perhaps 1000 Å thickness and consuming part of the polysilicon. Then, using a photoresist mask to expose only the erase window C at the part 25, the insulator layer 33 is etched away to leave bare the first level poly again. The layer 34 of silicon oxide is grown as before, but this layer is processed to enhance the erase mechanism by allowing electrons to penetrate. This is accomplished by making the oxide layer 34 thinner than layer 33, or by growing the oxide 34 at 900° or 1000° C. in dry O2.

After opening a contact area 22 for poly-to-moat contact, the second level polysilicon is next deposited over the entire top surface of the slice over the oxide layers 33 and 34, using a reaction as above, to provide the control gates 17 and 27 and the strips 18 and 21. The second level poly is subjected to a phosphorus implant as set forth in U.S. Pat. No. 4,110,776 issued to G. R. Mohan Rao et al., assigned to Texas Instruments, to produce the characteristics of the resistor R. Then an oxide coating 48 is produced by thermal oxidation. The second level poly is patterned using photoresist to define the strips 18 and 21, and the thin oxide layers 33, etc. are etched away in all areas except under the polysilicon strips. A photoresist mask and etch operation limits the coating 48 to only the areas above the resistor R. As seen in FIGS. 5e and 6e, a deposition and diffusion operation now produces the heavily doped N+ source and drain regions 10, 12, 19, 20 as well as the region 11 in the moat and the N+ region under the contact area 22. The depth of diffusion is about 8000 to 10,000 Angstroms. The N+ diffused regions function as conductors which connect the various regions together, and also function as the source or drain regions. This diffusion also heavily dopes all the exposed second level polysilicon areas except for the resistor area R.

Fabrication of the device is continued by depositing a layer 35 of glaze or phosphorus-doped oxide. Rather than by oxidizing, this is done by a low temperature reaction process using conventional chemical vapor deposition techniques. A layer of about 10,000 Angstroms is produced, covering the entire slice. This deposition is followed by a "densification" step wherein the slice is heated at 950 degrees C. for the purpose of eliminating minute holes or pores in the oxide. Subsequently, a photoresist operation opens windows in the oxide layer 35 in areas 14 and 24 where contact is to be made from metal to moat or from metal to the polysilicon layer. Then, a layer of aluminum is deposited on the entire slice, and etched away using photoresist masking to provide the desired pattern of metal interconnections 13 and 23.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically erasable insulated gate field effect transistor memory device comprising source and drain regions defined in a face of a body of semiconductor material, a floating gate on said face between the source and drain regions insulated from the semiconductor material by a gate insulator, a control gate overlying the floating gate insulated therefrom by an interlevel insulator, conductive means overlying said face and insulated therefrom by an insulating layer with a portion of the conductive means overlying a segment of the floating gate, an insulating coating on said segment separating the portion of the conductive means from said segment but permitting the floating gate to discharge electrons into the conductive means upon application of high voltage thereto and means to prevent the conductive means from discharging the floating gate in excess of a selected level.

2. A device according to claim 1 wherein said portion of the conductive means is separated from the remainder thereof by impedance means.

3. A device according to claim 2 wherein said portion of the conductive means is coupled to said source of said transistor by a control device which is rendered conductive when the voltage on said floating gate is less than a predetermined level.

4. A device according to claim 3 wherein said control device is a sensor transistor having a control gate and a floating gate.

5. A device according to claim 4 wherein the control gate and floating gate of the sensor transistor are integral with the control gate and floating gate, respectively, of the memory device.

6. A device according to claim 5 wherein the sensor transistor has a source connected to the source of the memory device and has a drain coupled to one end of said impedance means and to said portion of the conductive means.

7. A device according to claim 2 wherein the impedance means is an implanted resistor formed in a polycrystalline silicon layer.

8. A device according to claim 7 wherein the floating gate is a first level of polycrystalline silicon and said portion of the conductive means is a second level of polycrystalline silicon.

9. A semiconductor device comprising first and second regions defined in a face of a body of semiconductor material, a first control element on said face between the first and second regions insulated from the semiconductor material by a first insulator, a second control element overlying the first control element insulated therefrom by an interlevel insulator, conductive means overlying said face and insulated therefrom by an insulating layer with a portion of the conductive means overlying an extended segment of the first control element, the extended segment laterally spaced from the second control element on said face, an insulating coating on said segment separating the portion of the conductive means from said segment but permitting electron flow into the conductive means from the first control element through the insulating coating at said segment upon application of high voltage across the insulating coating and means to prevent the first control element from being discharged in excess of a selected level.

10. A device according to claim 9 wherein said first and second regions are source and drain of a field effect transistor and the first and second control elements are gates.

11. An electrically erasable insulated gate field effect transistor memory device comprising first source and drain regions defined in a face of a body of semiconductor material, second source and drain regions defined in said face, a floating gate on said face above a first channel between the first source and drain regions and above a second channel between the second source and drain regions insulated from the semiconductor material by a gate insulator, a control gate overlying the floating gate insulated therefrom by an interlevel insulator, conductive means overlying said face and insulated therefrom by an insulating layer with a portion of the conductive means overlying a segment of the floating gate laterally spaced from the first and second channels, an insulating coating on said segment separating the portion of the conductive means from said segment but permitting the floating gate to discharge electrons into the conductive means upon application of high voltage thereto and means connecting the conductive means to the second drain region to prevent discharging the floating gate in excess of a selected level.

12. A device according to claim 11 wherein said portion of the conductive means is separated from the remainder thereof by impedance means.

13. A device according to claim 11 wherein said portion of the conductive means is coupled to ground via said second source and drain regions which is a path rendered conductive when the voltage on said floating gate is less than a predetermined level.

14. A device according to claim 13 wherein said second source and drain regions provide a sensor transistor having a control gate and a floating gate.

15. A device according to claim 14 wherein the control gate and floating gate of the sensor transistor are integral with the control gate and floating gate, respectively, of the memory device.

16. A device according to claim 15 wherein the sensor transistor has a source connected to the source of the memory device and has a drain coupled to one end of said impedance means and to said portion of the conductive means.

17. A device according to claim 12 wherein the impedance means is an implanted resistor formed in a polycrystalline silicon layer.

18. A device according to claim 17 wherein the floating gate is a first level of polycrystalline silicon and said portion of the conductive means is a second level of polycrystalline silicon.

* * * * *